United States Patent
Chang et al.

(10) Patent No.: US 8,432,723 B2
(45) Date of Patent: Apr. 30, 2013

(54) NANO-ELECTRO-MECHANICAL DRAM CELL

(75) Inventors: Josephine B. Chang, Mahopac, NY (US); Leland Chang, New York, NY (US); Michael A. Guillorn, Yorktown Heights, NY (US); Brian J. Li, Yorktown Heights, NY (US); Steven John Koester, Ossining, NY (US)

(73) Assignee: International Business Machines Corporation, Armonk, NY (US)

( * ) Notice: Subject to any disclaimer, the term of this patent is extended or adjusted under 35 U.S.C. 154(b) by 155 days.

(21) Appl. No.: 13/015,936

(22) Filed: Jan. 28, 2011

(65) Prior Publication Data

US 2012/0195102 A1   Aug. 2, 2012

(51) Int. Cl.
*G11C 11/24* (2006.01)
*G11C 5/00* (2006.01)
*G11C 5/06* (2006.01)
*G11C 11/34* (2006.01)

(52) U.S. Cl.
USPC .............. 365/149; 365/52; 365/63; 365/186

(58) Field of Classification Search ............ 365/52, 365/63, 186
See application file for complete search history.

(56) References Cited

U.S. PATENT DOCUMENTS

| 6,473,361 | B1 | 10/2002 | Chen et al. | |
|---|---|---|---|---|
| 2001/0043545 | A1* | 11/2001 | Aratani | 369/95 |
| 2004/0066258 | A1* | 4/2004 | Cohn et al. | 335/78 |

FOREIGN PATENT DOCUMENTS

| WO | WO/2007/130913 | 11/2007 |
|---|---|---|
| WO | WO/2007/130919 | 11/2007 |

OTHER PUBLICATIONS

Jang, Cha, Choi, Kang, Butler, Hasko, Jung, Kim, Amaralunga, "Nanotube based Vertical Nano-devices for High Integration Density," Nanoelectronics, 2006 IEEE Conference on Emerging Technologies, pp. 89092.
Cassell, et al., "Carbon Nanotube Based Interconnect Technology: Opportunities and Challenges," Micro and Opto-Electronic Materials and Structures: Physics, Mechanics, Design, Reliability, Packaging, pp. A181-A204, 2007.
Akarvardar, et al., "Design Considerations for Complementary Nanoelectromechanical Logic Gates," Center for Integrated Systems, Stanford University, Stanford, CA, 2007 IEEE, pp. 299-302.

* cited by examiner

*Primary Examiner* — Ly D Pham
(74) *Attorney, Agent, or Firm* — Michael J. Buchenhorner; Vazken Alexanian

(57) ABSTRACT

A DRAM cell and method for storing information in a dynamic random access memory using an electrostatic actuator beam to make an electrical connection between a storage capacitor and a bit line.

14 Claims, 19 Drawing Sheets

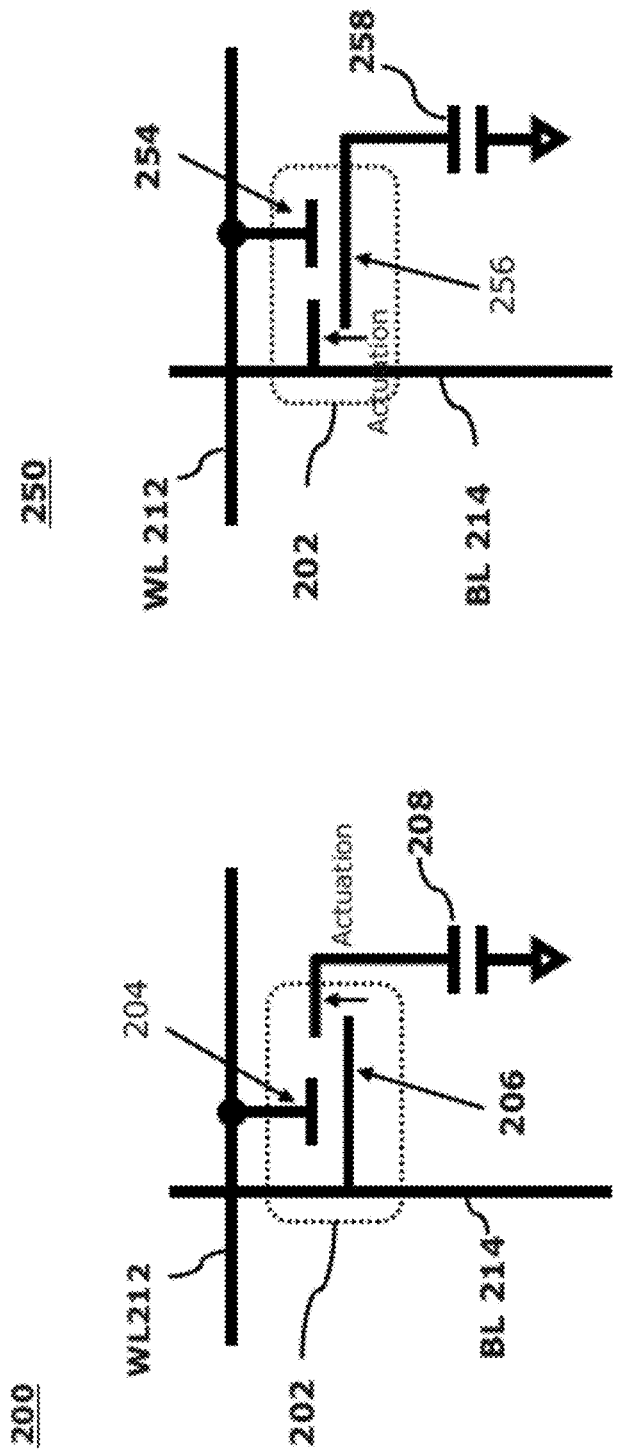

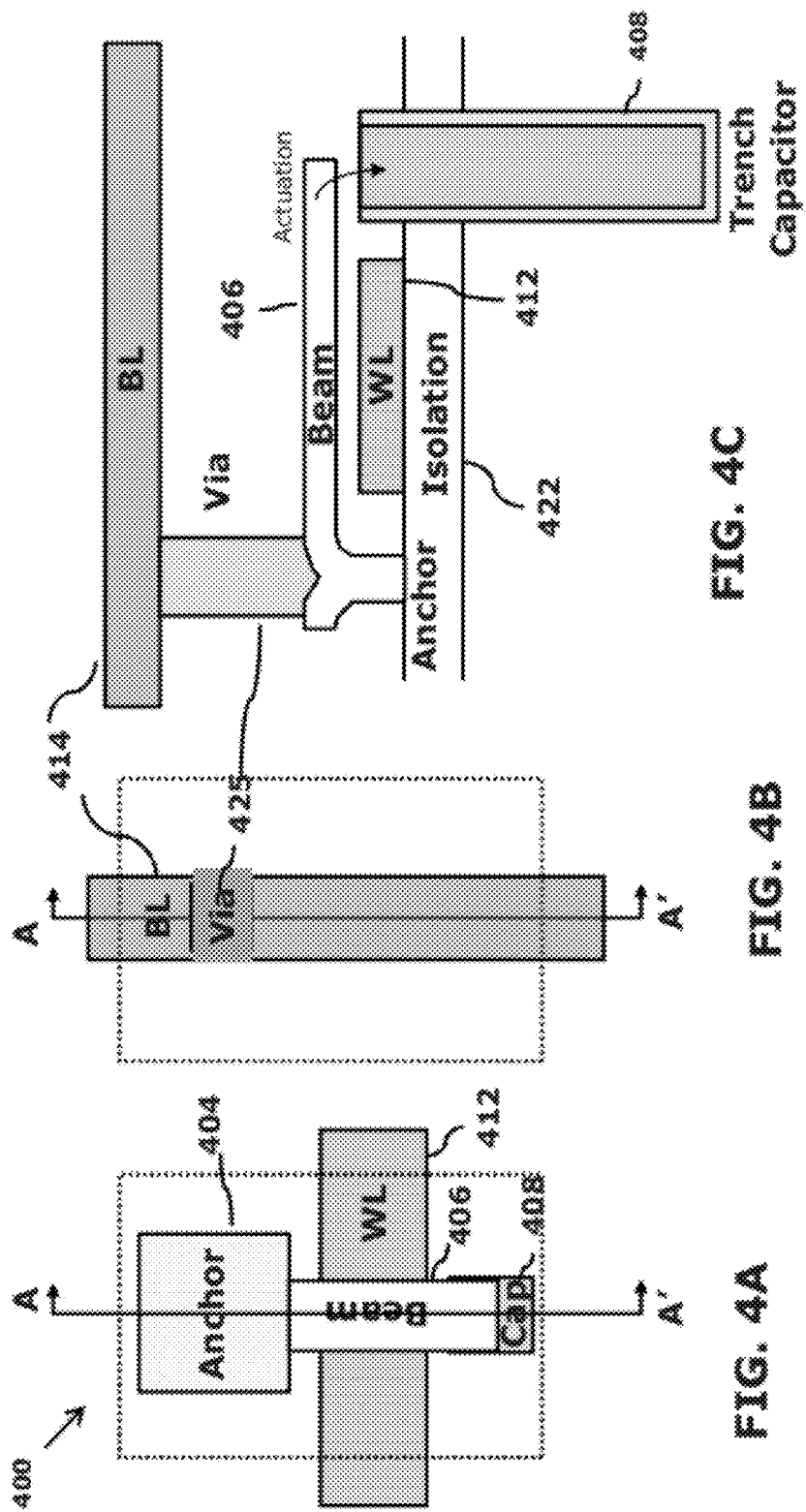

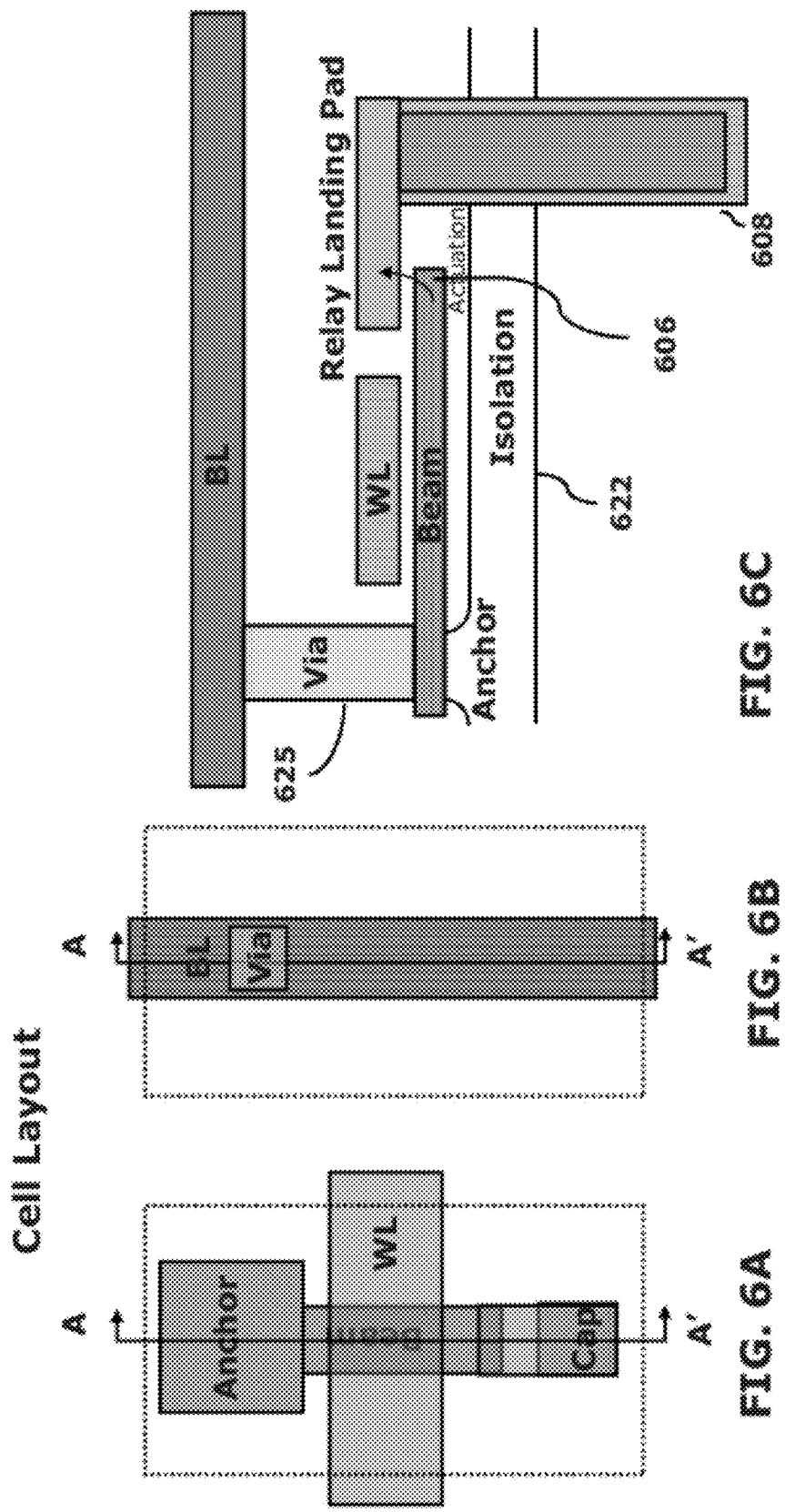

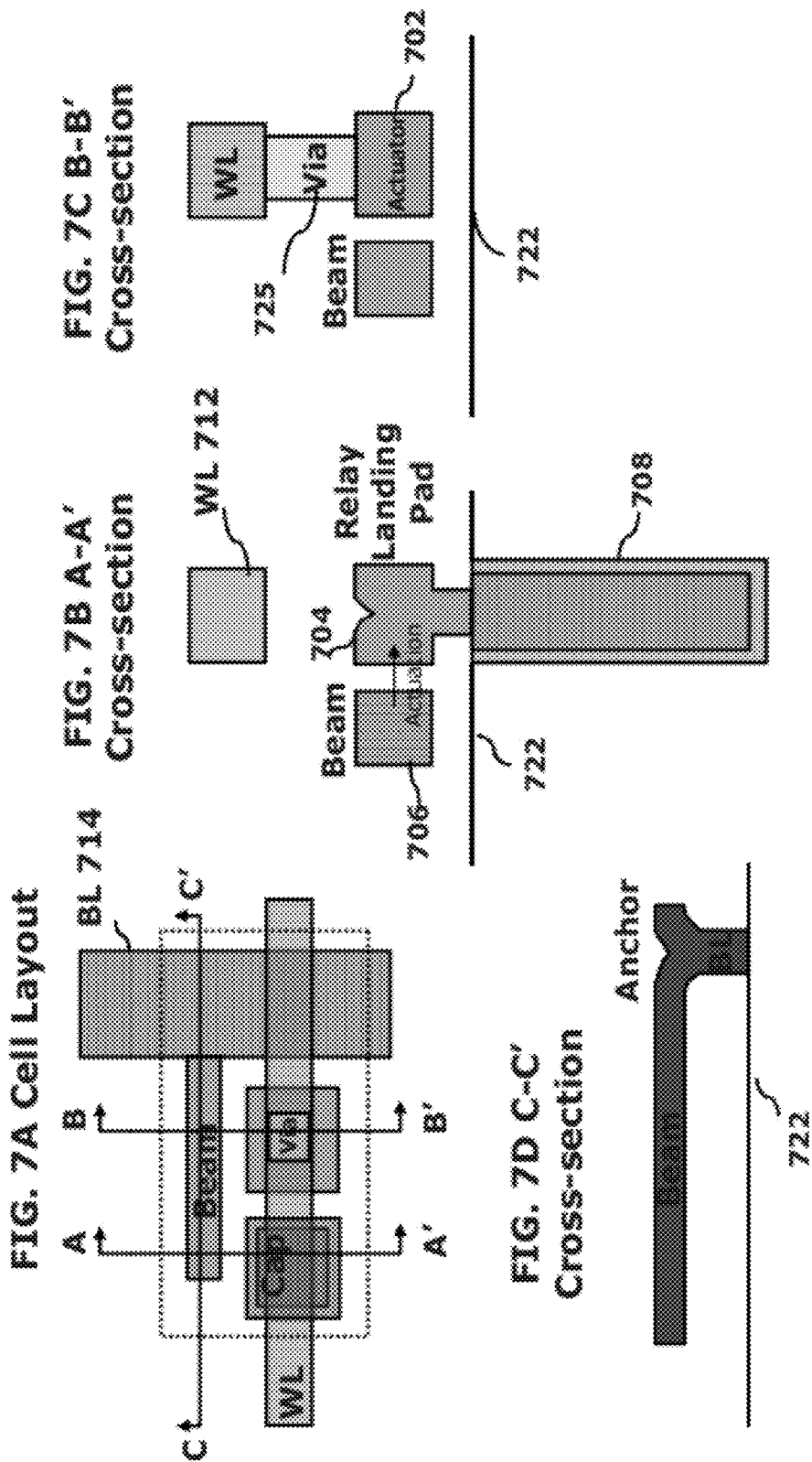

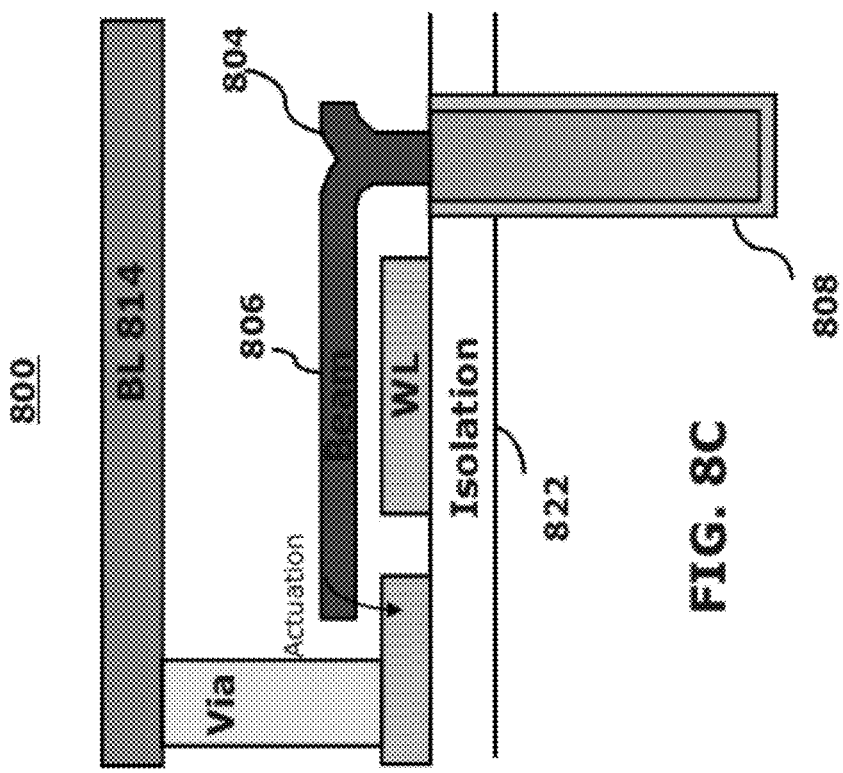
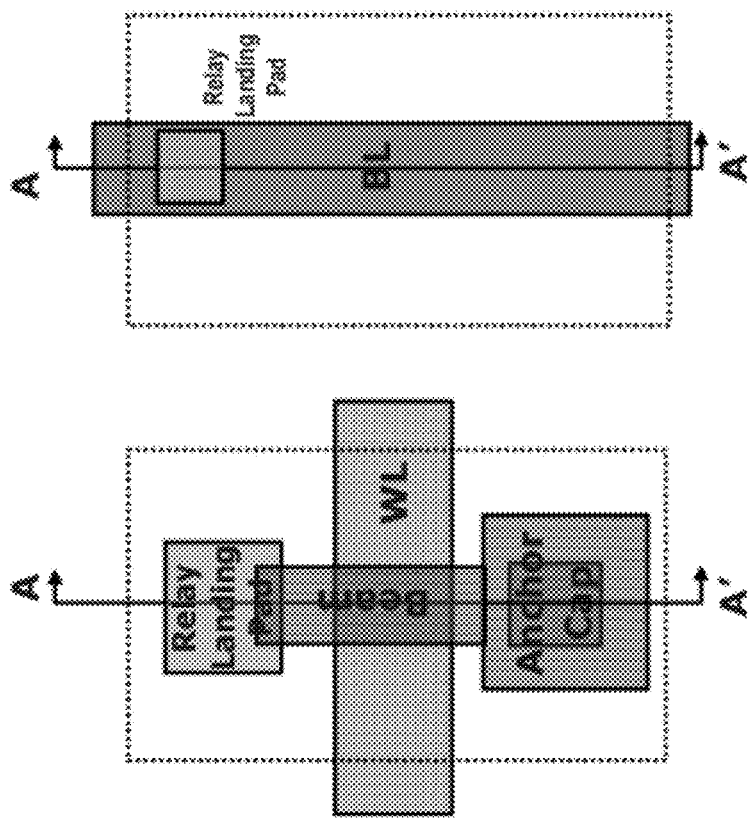
FIG. 8C
FIG. 8B
FIG. 8A
Cell Layout

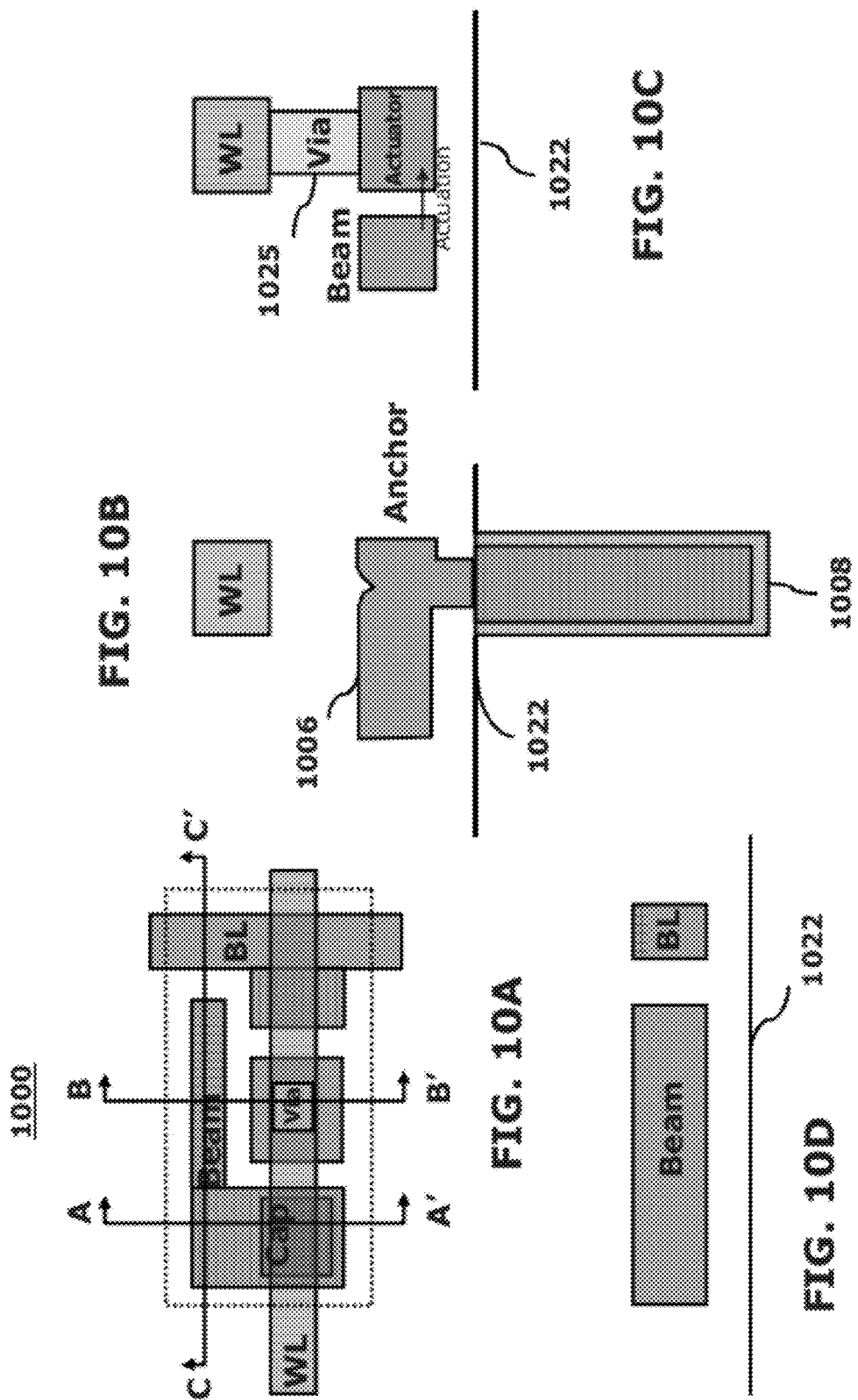

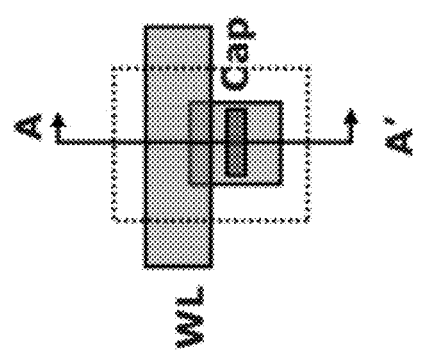
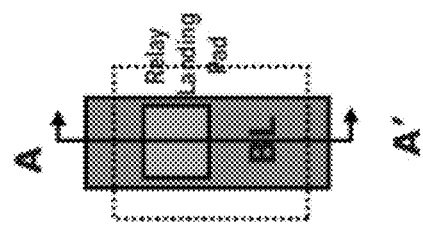
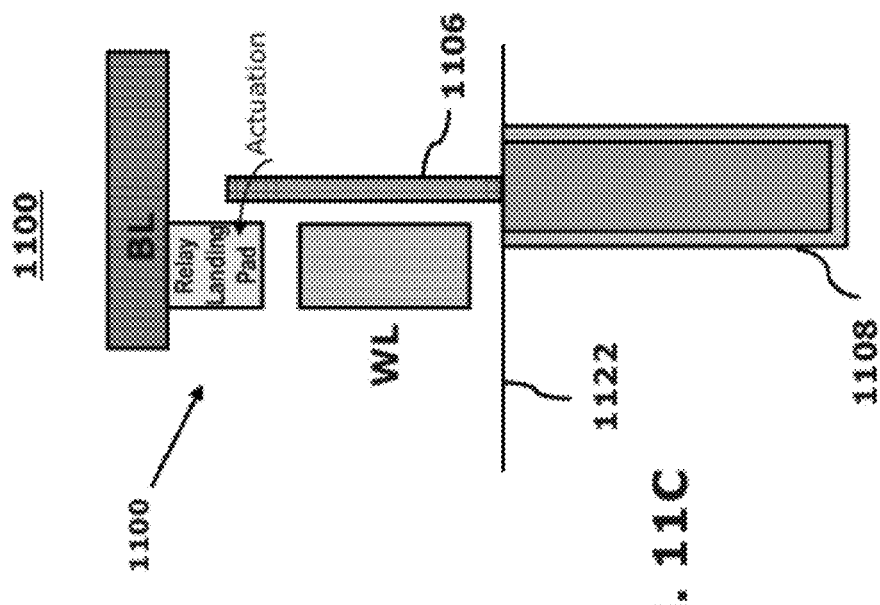

NANO-ELECTRO-MECHANICAL DRAM CELL

CROSS-REFERENCE TO RELATED APPLICATIONS

None.

STATEMENT REGARDING FEDERALLY SPONSORED-RESEARCH OR DEVELOPMENT

None.

INCORPORATION BY REFERENCE OF MATERIAL SUBMITTED ON A COMPACT DISC

None.

FIELD OF THE INVENTION

The invention disclosed broadly relates to the field of dynamic random-access memory (DRAM) cells and more particularly relates to the field of nano-electro-mechanical dynamic random-access memory (NEM-DRAM) cells.

BACKGROUND OF THE INVENTION

FIG. 1 shows an exemplary 1T1C (one-transistor, one capacitor) DRAM cell 100. This device includes a MOSFET pass-gate 102 and a storage capacitor 104 coupled therewith. The storage capacitor 104 uses either a trench technology or a stacked capacitor structure. The cell can be bulk-Si or Silicon on Insulator (SOI). This is currently the cell technology of choice for dense memory in both embedded and standalone applications. DRAM technology, however, inherently has a need for a non-negligible standby power supply due to the need to periodically refresh stored data. This is fundamental in a 1T1C cell since the current leakage of the pass-gate device in the DRAM cell is non-zero due to subthreshold, junction, and gate leakage currents.

As device dimensions are scaled, these currents inevitably increase due to short-channel effects, band-to-band tunneling, and gate oxide tunneling. Thus, especially in scaled technologies, standby power reduction in conventional DRAM is very difficult. With technology scaling, variability increases, which compounds these problems. In a large memory array, the refresh rate is limited by the cell with the lowest Vt (voltage) pass-gate while the performance is limited by the cell with the highest Vt pass-gate. With variability, the nominal device Vt must be very high to ensure that retention targets can be met. This requires very high channel doping, which, in turn, increases junction leakage and dopant-fluctuation-induced Vt variation.

Variability also means that the gate voltage (often charge-pumped to compensate for the Vt drop when the NFET pass-gate charges up the storage capacitor) on the pass-gate, such as word line (WL) high voltage, must be increased to maintain performance. This max voltage is now approaching fundamental limits in oxide breakdown characteristics.

Since VLSI technology is subject to power constraints, methods to reduce standby power are especially important. Reduced power benefits applications ranging from high performance (e.g. the amount of cache that can be added to a server is often limited by power dissipation) to low power (e.g. standby power for cellular phones determines battery life). Going forward, variability also limits DRAM scaling, which directly leads to tradeoffs in performance and/or power dissipation.

A mechanical memory cell has been proposed in the past, but this was targeted towards non-volatile memory applications and suffers from large cell size due to the need for multiple cantilever beams per cell. Single DRAM cell functionality based on mechanical actuation of carbon nanotubes has also been demonstrated, but the cell design is inadequate for efficient actuation of the cantilever beam (voltages of ~15V were necessary) and relies upon un-established devices in the form of carbon nanotubes, which cannot be applied to, for example, conventional trench capacitor structures.

SUMMARY OF THE INVENTION

Briefly, according to an embodiment of the invention a method comprises steps or acts of coupling a cantilever beam to a bit line of a memory array or storage node of a cell, wherein the cantilever beam is oriented parallel to a wafer substrate and is actuated upwards to make electrical connection between the storage node of the cell and the bit line; electrically connecting an electrostatic actuator to the word line of the memory array; and activating the cell by applying a high voltage to induce electrostatic pull-in of a relay to perform either a read or write operation.

According to another embodiment, a method comprises steps or acts of: coupling a cantilever beam to a bit line of a memory array or storage node of a cell, wherein the cantilever beam is oriented parallel to a wafer substrate and is actuated laterally to make electrical connection between the storage node of the cell and the bit line; electrically connecting an electrostatic actuator to the word line of the memory array; and activating the cell by applying a high voltage to induce electrostatic pull-in of a relay to perform either a read or write operation.

According to yet another embodiment, a method comprises steps or acts of coupling a cantilever beam to a bit line of a memory array or storage node of a cell, wherein the cantilever beam is oriented perpendicular to a wafer substrate and is actuated from the side to make electrical connection between the storage node of the cell and the bit line; electrically connecting an electrostatic actuator to the word line of the memory array; and activating the cell by applying a high voltage to induce electrostatic pull-in of a relay, thereby electrically connecting the storage node of the cell to the bit line to perform either a read or write operation.

BRIEF DESCRIPTION OF THE DRAWINGS

To describe the foregoing and other exemplary purposes, aspects, and advantages, we use the following detailed description of an exemplary embodiment of the invention with reference to the drawings, in which:

FIG. 2 shows two potential circuit schematics for a NEM-DRAM cell, according to an embodiment of the present invention: FIG. 2A shows the cantilever beam tied to the bit line and FIG. 2B shows the cantilever beam tied to the storage node;

FIG. 4A shows the device layer of a basic implementation of a NEM-DRAM cell using downward actuation, according to an embodiment of the present invention;

FIG. 4B show the wiring layout of a basic implementation of a NEM-DRAM cell using downward actuation, according to an embodiment of the present invention; and FIG. 4C shows the cross-section of the layout of FIG. 4A, according to an embodiment of the present invention;

FIGS. 6A through 6C show different views of a cell design that orients the cantilever beam parallel to the wafer substrate with upward actuation, according to an embodiment of the present invention;

FIGS. 7A through 7D show different views of a cell design that actuates a cantilever beam laterally, according to an embodiment of the present invention;

FIGS. 8A through 8C show different views of a cell design that orients the cantilever beam parallel to the wafer substrate with downward actuation that is anchored to the cell storage node, according to an embodiment of the present invention;

FIGS. 10A through 10D show different views of a cell design that orients the cantilever beam parallel to the wafer substrate with lateral actuation that is anchored to the cell storage node, according to an embodiment of the present invention;

FIGS. 11A through 11C show different views of a cell design that uses a vertical beam orientation, according to an embodiment of the present invention;

FIG. 12A shows a shallow trench isolation (STI) starting from an STI module of an eDRAM (embedded DRAM), post pad nitride strip;

FIG. 12N shows a step of bit line metallization; and

Figure 1:
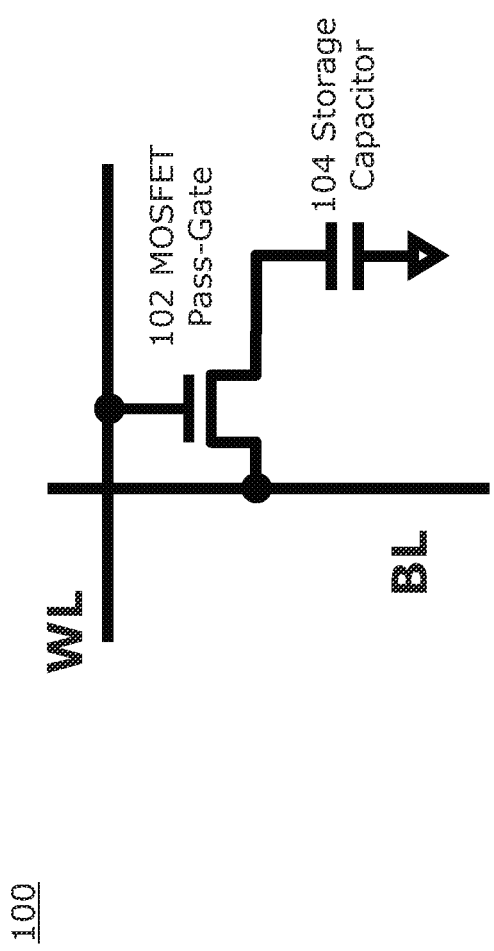
FIG. 1 is a schematic of a conventional DRAM cell.

While the invention as claimed can be modified into alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the scope of the present invention.

DETAILED DESCRIPTION

We describe a nano-electro-mechanical (NEM) relay (i.e., a switch) as the pass-gate in a DRAM cell. Such a device has effectively zero off-current. This eliminates the dominant leakage mechanism in a DRAM cell and could yield improvements in cell retention time by many orders of magnitude over known designs, thereby reducing DRAM standby power (due to refresh) by orders of magnitude. This enables dramatic improvements in DRAM power dissipation for a wide range of applications.

The DRAM structure has an actuating gate electrode separate from a vertical cantilever beam. The structure is a DRAM cell that depends on charge storage using a capacitor to hold state (does not depend on stiction at all, which can be very difficult to control), except that the pass-gate is formed using a mechanical switch. In our structure, the actuating gate exerts a direct electrostatic force on a single vertical cantilever beam, which moves it towards the gate to close the switch. To achieve sub-1V operation, the rough dimensions that are needed depend heavily on the Young's modulus of the beam material. For silicon, we need both the beam thickness and gap to be in the 10 nm (or below) range.

In addition, variability in a NEM relay-based DRAM cell can be less of an issue than in a conventional MOSFET-based DRAM cell, shown in FIG. 1. While the pull-in/pull-out voltages for a NEM relay will be affected by cantilever beam and gap thickness variation, the actual on- and off-currents in a NEM relay are relatively immune to variation. Thus, as long as proper voltage margins are maintained to contain the pull-in/pull-out voltages, variability has only a minor impact on NEM-DRAM. In contrast, variation affects all characteristics ($V_t$, $I_{on}$, $I_{off}$ of a MOSFET, thus limiting all DRAM cell specs.

We discuss cell designs that can enable area-efficient DRAM cell designs based on NEMS relays that can be practically combined with conventional (manufacturable) DRAM processes.

FIG. 2A shows a potential circuit schematic for a NEM DRAM cell 200 with the cantilever beam 206 tied to the bit line (BL) 214. To perform the function of a pass-gate device, the cantilever beam 206 can either be electrically connected to the bit line (BL) 214 of the memory array or the storage node 208 of the cell (as shown in FIG. 2B). An electrostatic actuator 204 is vertically electrically connected to the word line (WL) 212 of the memory array and coupled with the storage capacitor 208. To activate the memory cell 200, a high voltage, $V_{pp}$, is applied to the WL 212, which induces electrostatic pull-in of the NEM relay 202, thereby electrically connecting the storage node 208 of the cell 200 to the BL 214 to perform either a read or write operation. Example voltages include: $V_{pp}$=1.8V, $V_{dd}$=0.5V, $V_{contact}$, $V_{pull-out}$~1V. The cell 200 is in standby when differential voltage is less than the voltage pull-out applied between the BL 214 and the WL 212.

FIG. 2B illustrates a second option showing a cell 250 where the cantilever beam 256 is tied (coupled) to the storage capacitor 258. During a write operation, the bit line BL 214 would be set to either 0 or Vdd, depending on data. During a read operation, the BL 214 is be pre-charged to a pre-determined level in the 0-Vdd range (e.g., Vdd), which could then be charged or discharged through charge sharing with an activated cell. The actuator 254 is vertically connected to the WL 212.

In an inactivated memory cell, the WL 212 is biased to 0, which ensures electrostatic pull-out of the relay 202, thereby electrically isolating the storage node 258 of the cell 250 from the BL 214. In this state, the relay 202 is open, and the leakage current is effectively zero, which minimizes the need for cell refresh. Implicitly, the operation as described above assumes some constraints on $V_{pp}$ and $V_{dd}$. Here the cantilever beam 256 is coupled (tied) to the storage node (capacitor 258). This cell 250 is in standby mode when the differential voltage is less than Vpull-out applied between the storage node 258 and the word line (WL) 212.

Figure 3A:
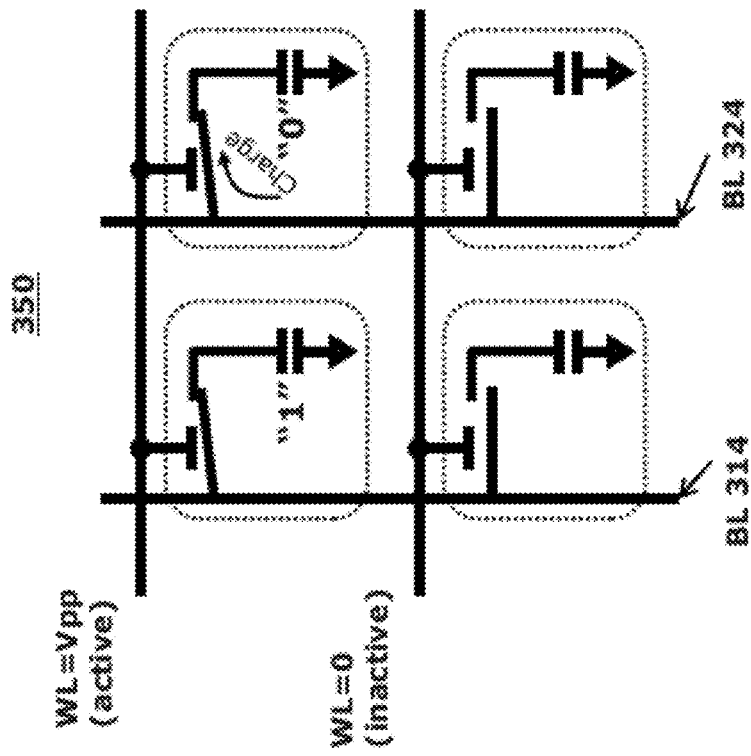
FIGS. 3A and 3B show possible potential configurations for activated and inactivated cells of state "1" and "0," for a write and a read operation, respectively, according to an embodiment of the present invention.
Figure 3B:
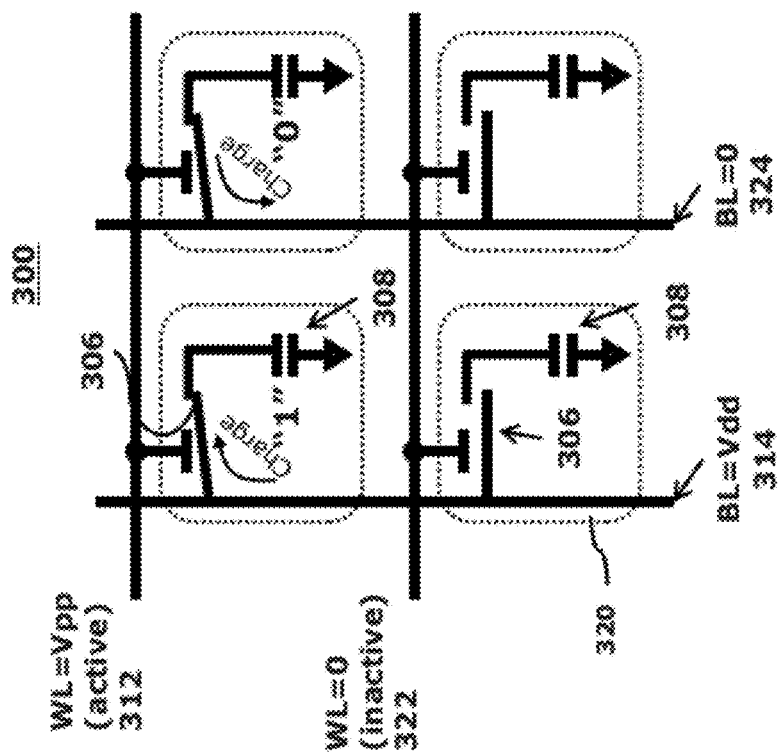

FIGS. 3A and 3B show possible potential configurations for activated and inactivated cells of state "1" and "0." FIG. 3A shows a write operation 300 while FIG. 3B shows a read operation 350. The DRAM cell in the active state 308 shows the cantilever beam 306 in a closed position wherein it connects to a storage capacitor 308. The cantilever beam 306 extends from the bit line (BL) 314 to make contact with the storage capacitor 308.

The DRAM cell in the inactive state 320 shows the cantilever beam 306 in the open position wherein it does not make contact with the storage capacitor 308. The BL and storage node 308 potentials are data dependent and could each be either BL=0 324 or BL=Vdd 314. Since we desire that the WL 322 controls pull-in of the relay, these potentials should not affect the relay. The constraints are as follows: a) so that the inactive WL 322 pulls out, the $V_{dd}$ should be chosen to be lower than the pull-out voltage, $V_{pull-out}$, of the cantilever beam 306 (which is determined by beam and gap dimensions and material constants); and b) so that the active WL 312 pulls in, $V_{pp}$–$V_{dd}$ should be greater than $V_{pull-in}$.

If the off-state potential of the WL 312 is also in the 0-$V_{dd}$ range, then it can be ensured that the relay is open and that the cell 320 is in the standby state. When the WL 312 is set to $V_{pp}$, then the relay should be closed. To ensure this, $V_{pp}$-$V_{dd}$ (since the potential of the beam could be at $V_{dd}$) must be larger than the pull-in voltage, $V_{pull-in}$, of the cantilever beam. In a cantilever beam system, $V_{pull-in}$ is larger than $V_{pull-out}$; as a result, it is practical to expect that $V_{pp}$>$V_{dd}$. This is analogous to a conventional DRAM array design, in which a charge-pumped $V_{pp}$>$V_{dd}$ is used to activate the WL.

For the read operation 350, both BL 314 and BL 324 are precharged to Vdd, but the BL 324 discharges slightly (triggers sense amp). Depending on the specific design parameters, electrostatic pull-in is not essential for device operation—it is only the motion of the cantilever beam that is needed to open and close the relay switch. Switching of a NEM relay can be on the order of ~1 nano second when practical materials and device dimensions are considered. Since the on-current of a NEM relay can be quite high, the actual charging and discharging of the storage capacitor can be quite fast.

Thus, the time needed to physically move the cantilever beam 306 is likely to dominate the read/write access latency of a NEM-DRAM cell. Such switching times are acceptable for even high-performance DRAM applications. Since the leakage current of a NEM relay pass-gate is essentially zero, it eliminates one constraint on the minimum cell capacitance. This could allow for the use of smaller storage capacitors and thus ease fabrication (e.g., shallower trench capacitor, thicker capacitor dielectric to further reduce leakage, and so forth).

With a NEM relay pass-gate, the number of bits sharing a single BL can be increased, thus improving array efficiency (i.e., percentage of array macro area occupied by cells). This is because the zero leakage at current eliminates noise margin concerns to BL leakage, and also because the on-resistance of a NEM relay can be lower than that of a MOSFET, which enables fast read access despite the higher BL capacitance due to the increased BL length.

A basic implementation of a NEM-DRAM cell showing downward actuation is shown in FIGS. 4A, 4B, and FIG. 4C. The diagram (and all subsequent cell layouts/cross-sections) assumes a trench capacitor 408 structure, but it should be apparent to one skilled in the art how the techniques presented here can be applied to a stacked capacitor structure. The specific process flows and design layers (both in material and potential layer sharing with integrated CMOS) by which these structures can be fabricated vary tremendously. We provide sketches of the final structure and do not wish to limit the structure to specific methods of fabrication.

FIG. 4A shows a basic cantilever beam 406 oriented parallel to the wafer substrate 422 that is actuated from below to make the electrical connection to a trench capacitor 408. A cell 400 includes an anchor 404, a beam 406, a WL 414 and a capacitor 408. In this embodiment the beam 406 is a horizontal structure that when activated moves down to make contact with the capacitor 408. A via 425 can be used to make contact to the beam 406 and to route the BL 414 in a separate layer so that it is perpendicular to the WL 412. FIG. 4A shows the device layers; FIG. 4B shows the wiring layers, and FIG. 4C shows the cell layout in cross-section.

Figure 5B:
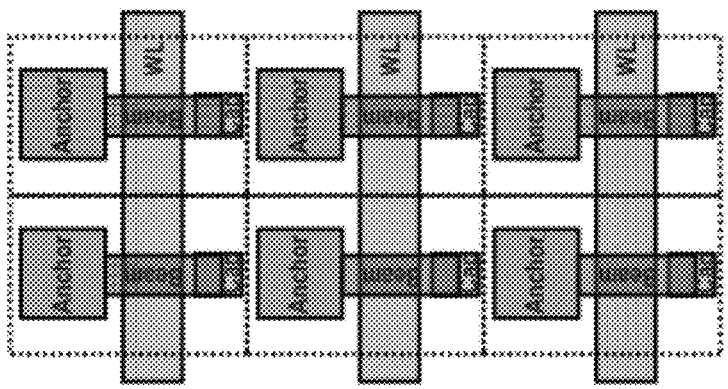
FIG. 5 shows two layouts in which the exemplary cell of FIG. 4A can be tiled out into an array, according to an embodiment of the present invention.
Figure 5A:
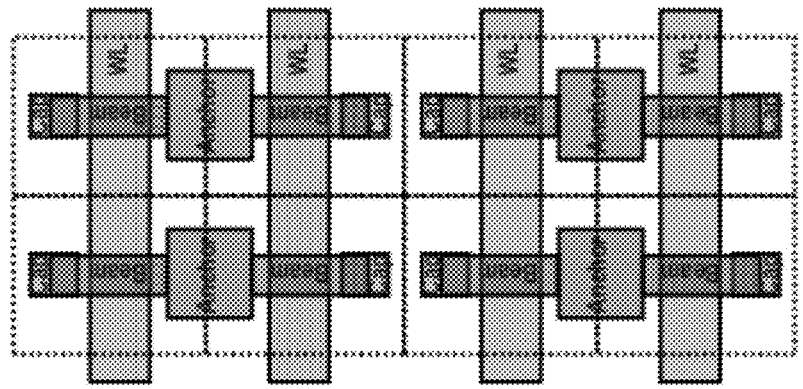

FIG. 5 shows two array layouts in which the exemplary cell of FIG. 4 can be tiled out into an array. FIG. 5A shows that symmetric tiling in the vertical direction can be used to horizontally and vertically translate the cell. FIG. 5B illustrates mirror-image tiling in the vertical direction. Mirror-image tiling can be used to share the anchor for the cantilever beam, which can reduce cell area. This does, however, reduce trench capacitor pitch, which may be more difficult to fabricate.

FIG. 6 shows a cell design with upward actuation that again orients the cantilever beam 606 parallel to the wafer substrate 622, but is actuated from above to make contact to a conducting layer tied to the trench capacitor 608. FIG. 6A shows the device layers of the cell; FIG. 6B shows the wiring layers through the via 625; and FIG. 6C shows the cross-section view. Due to additional spacing required between the beam 606 and the trench capacitor 608, this cell size may be somewhat larger than that shown in FIG. 4. However, such a structure may be more compatible with traditional CMOS processes because one possible implementation could be to use an SOI layer for the beam and a MOSFET gate layer for the actuator.

FIGS. 7A through 7D show different views of a NEM-DRAM cell design with lateral actuation that actuates the cantilever beam 706 (again oriented parallel to the wafer substrate 722) laterally. FIG. 7A shows the cell layout. FIG. 7B shows the cross-section through the relay landing pad 704. FIG. 7C shows the cross-section through the via 725. FIG. 7D shows the cross-section through the beam 706. The actuator 702 can be placed adjacent to the beam 706 to make lateral electrical contact to the trench capacitor 708. This requires wiring of the WL 712 signal in a separate layer so that it may run perpendicular to the BL 714.

FIGS. 8, 9, and 10 show cell structure designs that can be derived from the cell designs in FIGS. 4, 6, and 7. The basic cell arrangement in these cells differ from the arrangements shown in FIGS. 4, 6, and 7 primarily in the anchor point of the cantilever beam. FIGS. 8A, 8B, and 8C show different views of the cell layout of a cell design 800 with downward actuation of the beam 806. FIGS. 8A, 8B, and 8C show the device layers of the cell layout, the wiring layers, and the cell layout cross-section, respectively, of the cell design 800. The anchor point 804 of the cantilever beam 806 is placed to make electrical contact with the trench capacitor 808 instead of the BL 814.

Figure 9C:
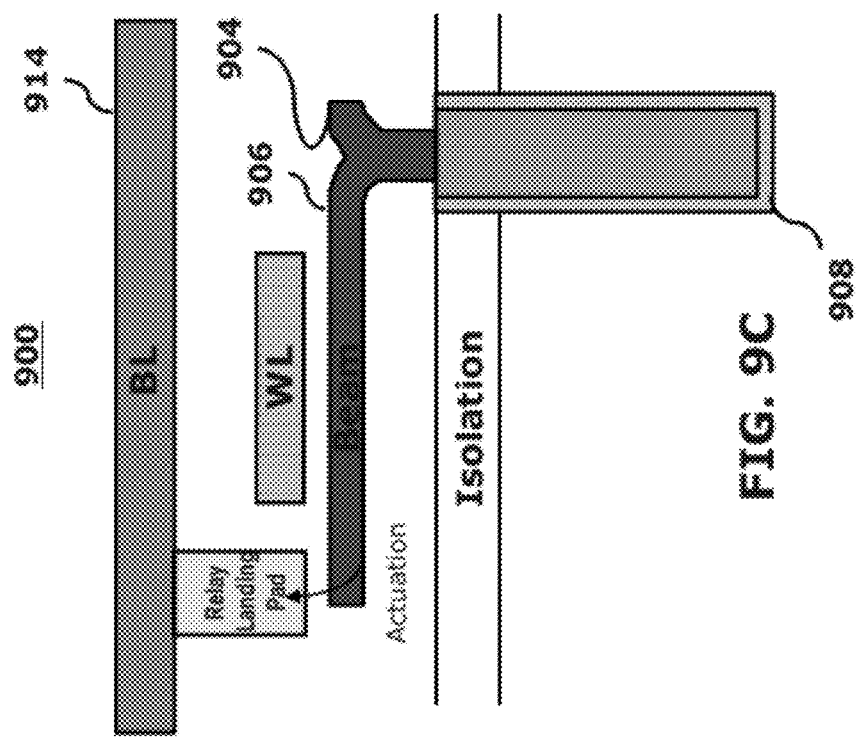
FIGS. 9A through 9C show different views of a cell design that orients the cantilever beam parallel to the wafer substrate with upward actuation that is anchored to the cell storage node, according to an embodiment of the present invention.
Figure 9B:
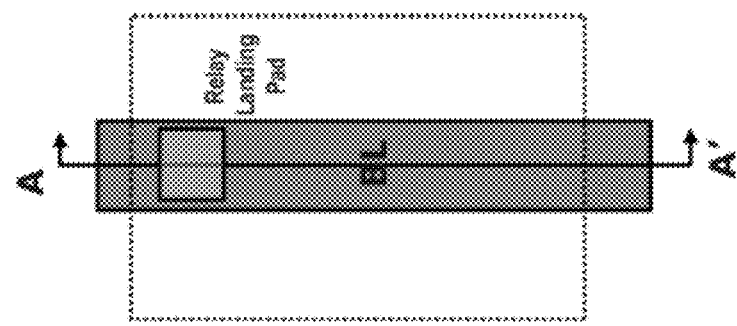
Figure 9A:
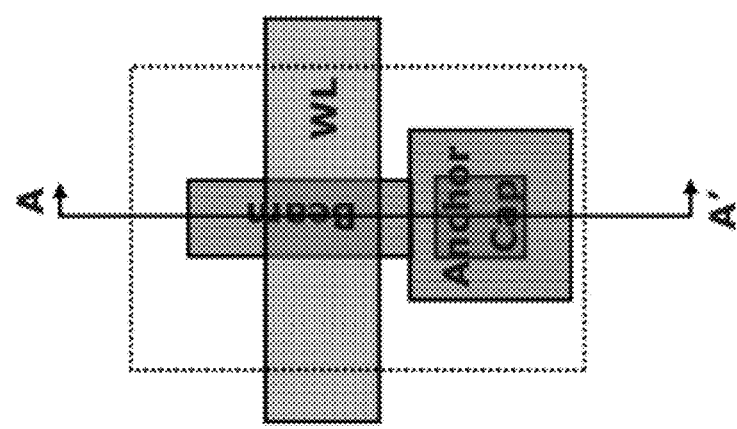

FIGS. 9A through 9C show different views of the cell design with upward actuation of the beam 906. FIGS. 9A, 9B, and 9C show the device layers, the wiring layers, and the cell layout cross-section, respectively, of the cell design 900. The anchor point 904 of the cantilever beam 906 is placed to make electrical contact with the trench capacitor 908 instead of the BL 914.

FIGS. 10A through 10D show different views of a NEM-DRAM cell design 1000 with lateral actuation of the beam 1006. The cell layout 1000 is shown in FIG. 10A. FIG. 10B shows a cross-section view through the trench capacitor 1008. FIG. 10C shows a cross-section through the via 1025. FIG. 10D shows a cross-section view through the beam 1006. Note that the beam 1006 in this embodiment is parallel to the wafer substrate 1022.

FIGS. 11A through 11C show different views of a NEM-DRAM cell design 1100 that uses a vertical beam 1106 orientation (perpendicular to the wafer substrate 1122) to create a NEM-DRAM cell 1100 with the smallest possible areal footprint. FIG. 11A shows the device layers of the cell layout 1100. FIG. 11B shows the wiring layer of the cell 1100. FIG. 11C shows a cross-section view of the cell layout 1100. The beam 1106 is in contact with the trench capacitor 1108. The cell size could potentially be as small as a $6F^2$ DRAM design, with a length of approximately 3F and a width of 2F. This size, in addition to providing dramatic standby power reduction, is smaller than many conventional DRAM cells.

Figure 12A:
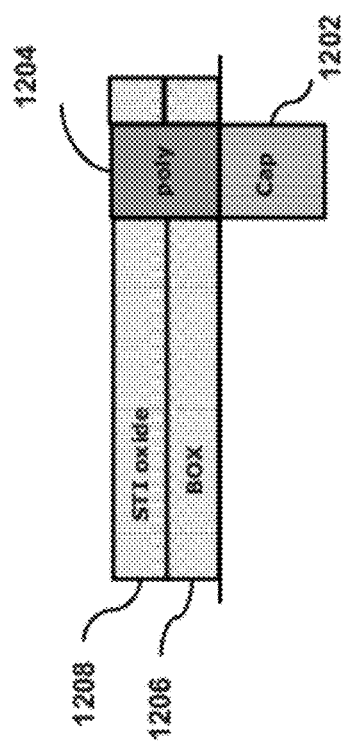
FIGS. 12A-N show the physical structure of the basic memory cell structure as it is fabricated according to the invention.
Figure 12B:
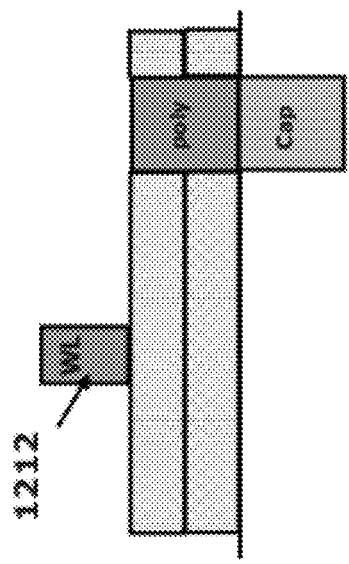
FIG. 12B shows depositing poly during fabrication of the gate stack module and pattern using standard PC module processing.
Figure 12C:
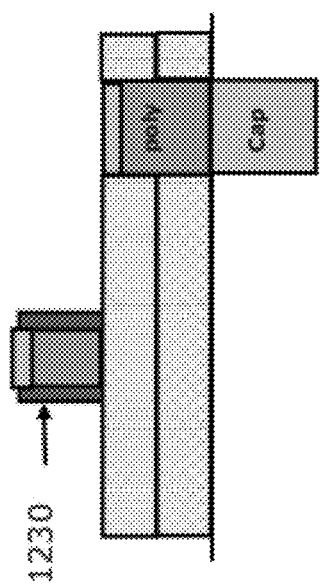
FIG. 12C shows completion of the FEOL (front end of the line)
Figure 12D:
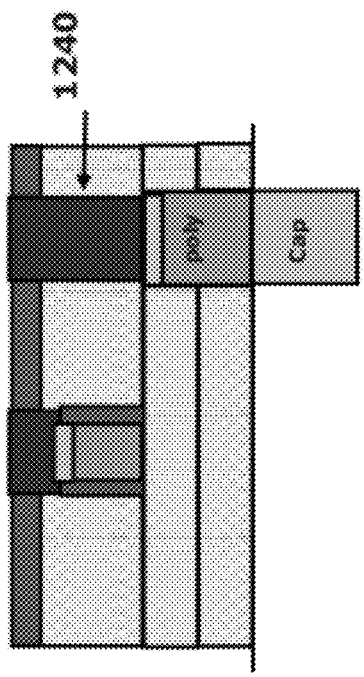
FIG. 12D shows the MOL (middle of line) part of the process.
Figure 12E:
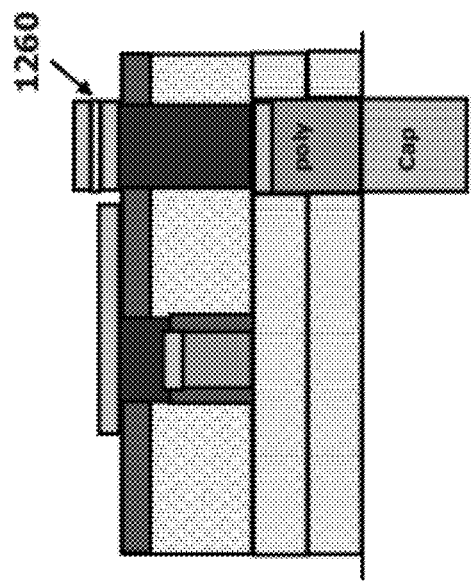
FIG. 12E shows a step of actuator formation.
Figure 12F:
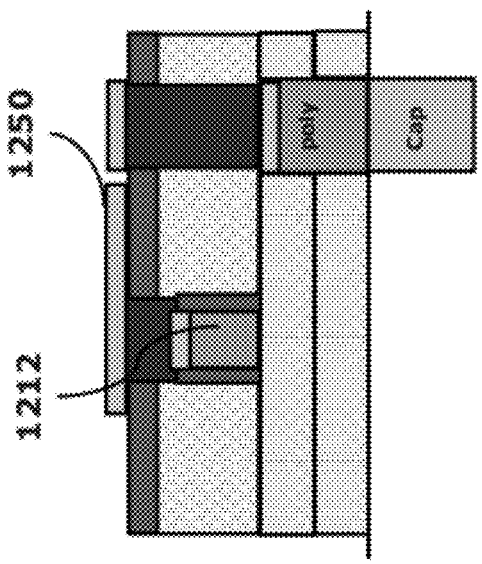
FIG. 12F shows a contactor formation.
Figure 12H:
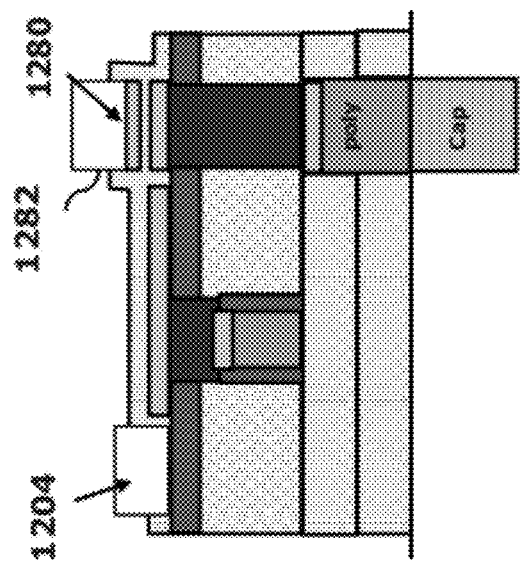
FIG. 12H shows a step of anchor point definition.
Figure 12G:
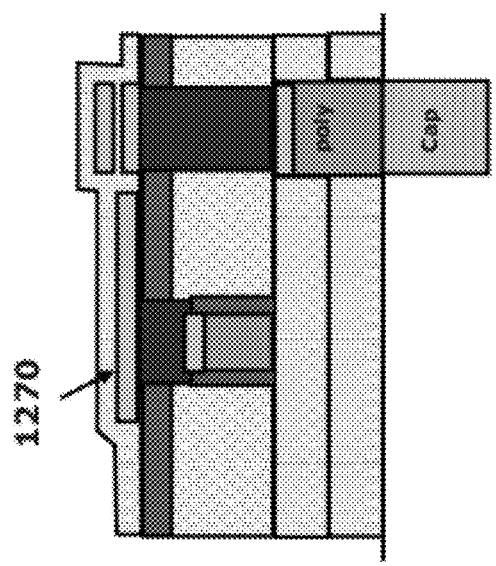
FIG. 12G shows an oxide deposition.
Figure 12J:
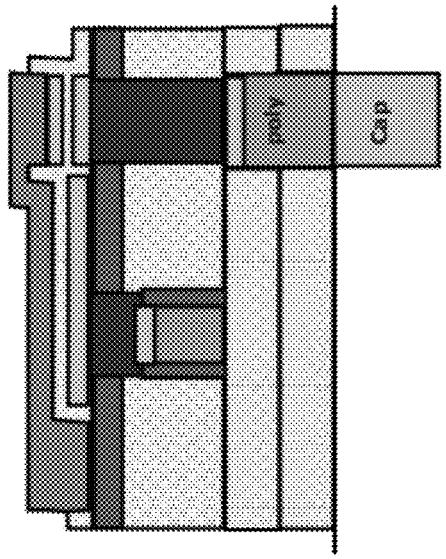
FIG. 12J shows a step of cantilever patterning.
Figure 12I:
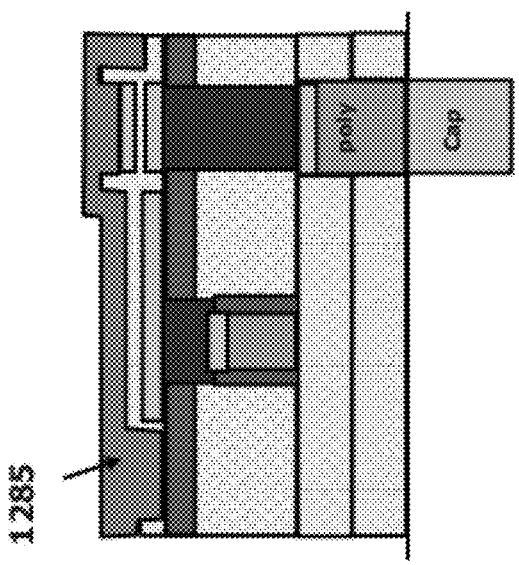
FIG. 12I shows a step of cantilever metallization.
Figure 12L:
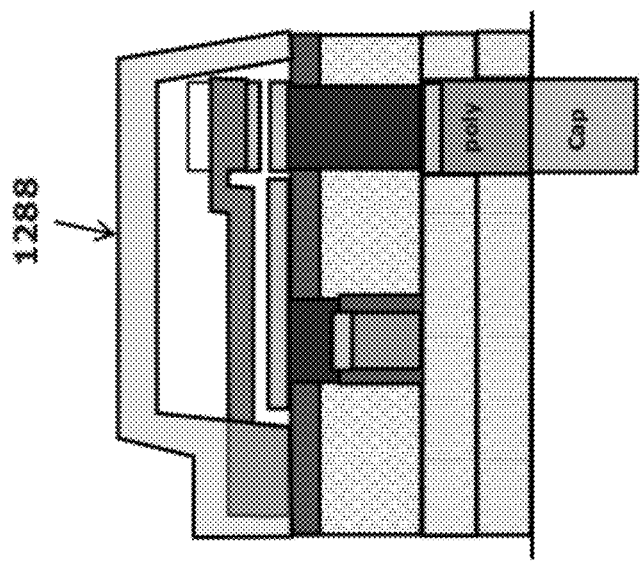
FIG. 12L shows a step of encapsulation bubble.
Figure 12K:
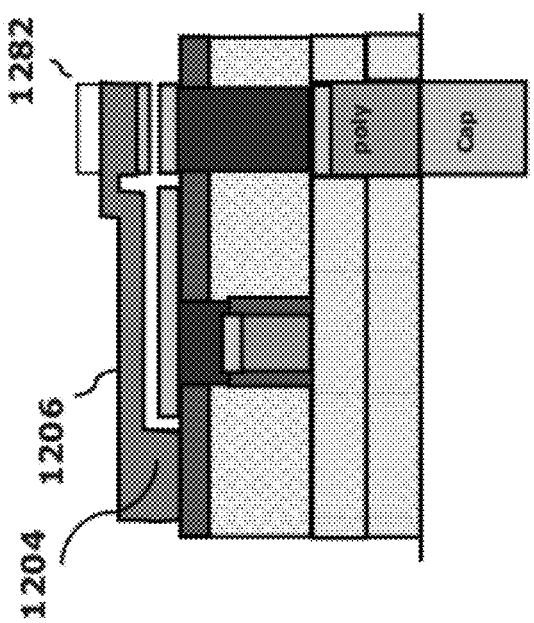
FIG. 12K shows a step of cantilever release.
Figures 12M, 12N:
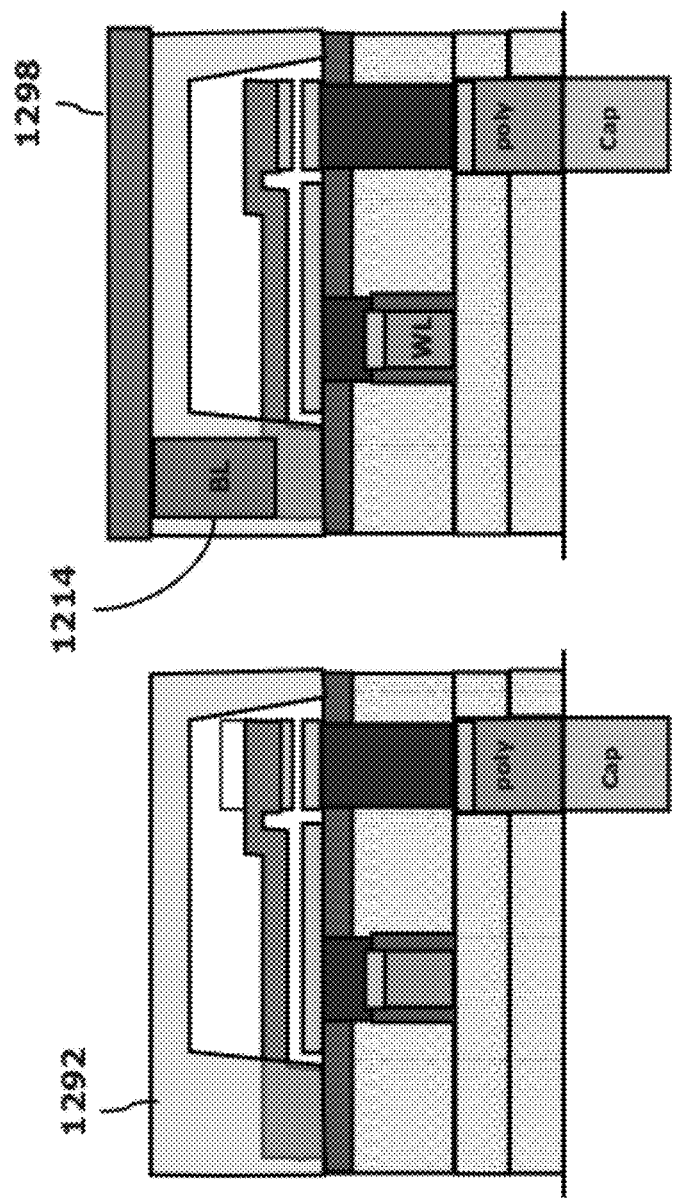
FIG. 12M shows a step of bubble sealing.

FIGS. 12A-N shows the physical structure of the basic NEM-DRAM cell of FIG. 4 during fabrication, according to an embodiment of the present invention. These figures focus on CMOS (complementary metal-oxide semiconductor) integration of a vertical gap cell.

FIG. 12A shows a silicon substrate after formation of the shallow trench isolation (STI) cap 1202 as might be used in a standard SOI eDRAM (embedded DRAM) process. The trench capacitor 1202 structure has already been formed according to standard techniques. The structure is shown post pad nitride strip.

FIG. 12B shows WL formation by depositing polysilicon (poly) during fabrication of the gate stack module and patterning using standard PC module processing. Using polysilicon (poly) for the WL 1212 allows for a denser cell and easier process than otherwise using the SOI active layer (RX).

FIG. 12C shows completion of the FEOL (front end of the line) as would be used for standard MOSFET fabrication with spacers 1230, and implants. This requires proceeding through FEOL as normal up through the silicide module.

FIG. 12D shows the MOL (middle of line) stage of the process. This requires depositing an oxide and nitride stack, performing contact (CA) patterning by lithography, RIE (reactive ion etching) and tungsten (W) metallization 1240. The nitride must be high quality and low temperature (e.g. sputtered SiN).

FIG. 12E shows the actuator formation step. This requires depositing a blanket metal layer 1250 (e.g. platinum) with sputtering and pattern with lithography and ion milling. The contact to the WL 1212 should be as close as possible to the capacitor contact.

FIG. 12F shows the contactor formation step. This requires depositing blanket metal (e.g. platinum) and a thin $SiO_2$ layer pattern 1260 with litho and ion milling. The $SiO_2$ layer is preferably between 5 and 10 nm.

FIG. 12G shows a conformal oxide deposition step to define the gap between the WL electrode and the BL cantilever beam 1206. The $SiO_2$ 1270 is deposited conformally, at a thickness of approximately 50 nm.

FIG. 12H shows the anchor point definition step. This requires patterning contact holes in the top oxide layer to open an anchor point 1204 and to form an electrical connection 1280 to the contactor 1282.

FIG. 12I shows the cantilever metallization step to deposit the cantilever material 1285. This requires depositing metal or metal multilayer to achieve a "zero stress" layer 1285.

FIG. 12J shows the cantilever patterning step. This requires lithography and patterning using either dry etching or ion milling of the cantilever material 1285.

FIG. 12K shows the cantilever release step. This requires sacrificial oxide removal using HF (hydrogen fluoride) etching and super critical drying. It is important to note that the gap between the contactor 1282 and the cantilever beam 1206 is smaller than the gap between the actuator 1204 and the cantilever beam 1206.

FIG. 12L shows the formation of an encapsulation bubble 1288, which can be performed by using resist as a sacrificial material. Low temperature PECVD (Plasma Enhanced Chemical Vapor Deposition) oxide can be deposited over the resist, lithography and RIE can be used to open release holes in the oxide, and dry etching (which avoids stiction issues) can be used to remove the resist.

FIG. 12M shows the bubble sealing step of the process wherein the encapsulation bubble is sealed. Sealing of the holes used to remove the sacrificial resist requires using sputtered oxide followed by PECVD oxide deposit 1292 and planarization as in a standard BEOL process.

FIG. 12N shows the BL 1214 metallization step. This requires proceeding with standard back-end-of-line (BEOL) metallization 1298 to form the BL 1214.

Figure 13:
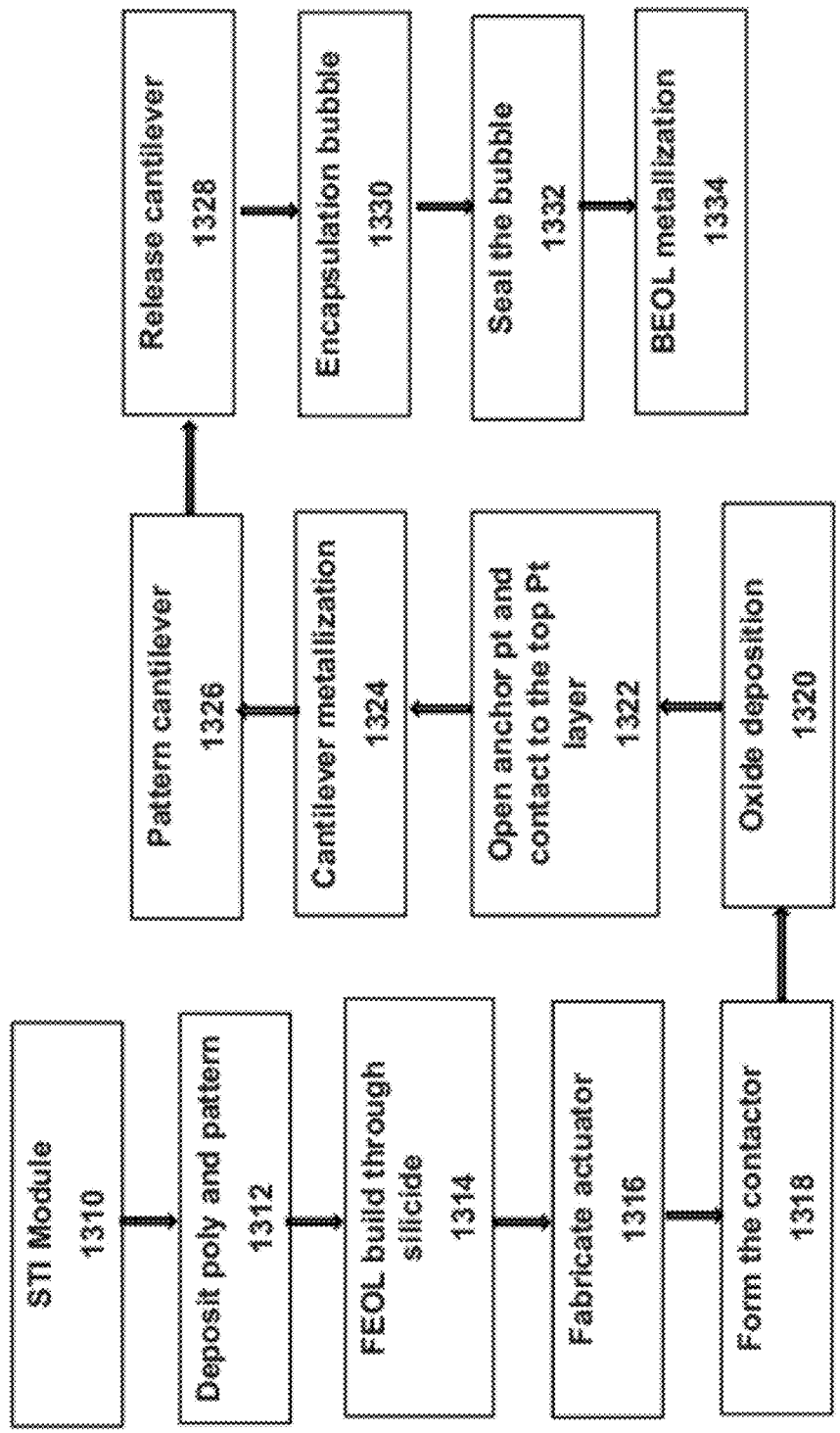
FIG. 13 shows a flowchart of a fabrication method according to an embodiment of the present invention.

FIG. 13 is a flowchart of the fabrication steps as described above. The process begins at step 1310 with an STI module, then proceeds with the deposition and patterning of polysilicon in step 1312. Next at step 1314 we perform an FEOL build through the silicide, followed by fabrication of the actuator 1250 in step 1316. In step 1318 the contactor 1282 is formed, followed by oxide deposition at step 1320.

Next, in step 1322 we open an anchor point 1204 and contact to the top Pt layer, followed by metallization and forming of the cantilever 1206 at step 1324. The cantilever 1206 is then patterned in step 1326. After patterning, the cantilever 1206 is released in step 1328. An encapsulation bubble 1288 is formed over the module in step 1330, after which the bubble 1288 is sealed in step 1332. BEOL metallization completes the process at step 1334.

Therefore, while there has been described what is presently considered to be the preferred embodiment, it will understood by those skilled in the art that other modifications can be made within the spirit of the invention. The above descriptions of embodiments are not intended to be exhaustive or limiting in scope. The embodiments, as described, were chosen in order to explain the principles of the invention, show its practical application, and enable those with ordinary skill in the art to understand how to make and use the invention. It should be understood that the invention is not limited to the embodiments described above, but rather should be interpreted within the full meaning and scope of the appended claims.

We claim:

1. A dynamic random-access memory (DRAM) structure comprising:
   a word line;
   a bit line; and
   a nano-electro-mechanical (NEM) relay comprising:
      a cantilever beam;
      a storage capacitor; and
      an electrostatic actuator gate coupled with the storage capacitor and vertically electrically connected to the word line, wherein said electrostatic actuator is separate from the cantilever beam and applies a high voltage to cause the cantilever beam to electrically connect the storage capacitor to the bit line to perform either a read or write operation.

2. The structure of claim 1 wherein the electrostatic actuator causes the cantilever beam to connect the bit line to the storage capacitor when actuated.

3. The structure of claim 2 wherein, during a read operation the bit line is set to a predetermined level in the zero to $V_{dd}$ range and then used to charge or discharge the storage capacitor in an activated cell.

4. The structure of claim 3 wherein, during a write operation, the bit line is first set to zero volts to write a logical zero or Vdd to write a logical one.

5. The structure of claim 2 wherein the cantilever beam is coupled to the bit line and moves from a first position wherein said cantilever beam does not make electrical contact with the storage capacitor to a second position wherein said cantilever beam makes contact with the storage capacitor, responsive to a pull-in voltage applied between the bit line and the word line.

6. The structure of claim 5 wherein the cell is in a standby mode when a differential potential below the pull-out voltage is applied between the bit-line and the word line.

7. The structure of claim 2 wherein the cantilever beam is coupled to the storage capacitor and moves from a first position wherein said cantilever beam does not make electrical contact with the bit line to a second position wherein said cantilever beam makes contact with the bit line responsive to a pull-in voltage applied between the storage capacitor and the word line.

8. The structure of claim 7 wherein the cell is in a standby mode when a differential potential below the pull-out voltage is applied between the storage capacitor and the word line.

9. The structure of claim 1 wherein the cantilever beam is electrically connected to the bit line, located next to the storage capacitor, and upon actuation, said cantilever beam makes contact with the storage capacitor.

10. The structure of claim 9 wherein the cantilever beam is a lateral beam actuated upwards.

11. The structure of claim 9 wherein the cantilever beam is a lateral beam actuated laterally.

12. The structure of claim 1 wherein the cantilever beam is a vertical beam actuated side-to-side.

13. A method for fabricating a dynamic random-access memory (DRAM) cell, said method comprising:
    forming a nano-electro-mechanical (NEM) relay by:
        coupling a cantilever beam to a bit line of a memory array;
        wherein said cantilever beam is oriented parallel to a wafer substrate (laterally) that is actuated downward by making an electrical connection to a storage capacitor; and
        activating the cell by applying a high voltage to an electrostatic actuator to cause the cantilever beam to make an electrical connection to the storage capacitor, thereby electrically connecting the storage capacitor of the cell to the bit line to perform either a read or write operation.

14. A dynamic random-access memory (DRAM) array structure comprising a plurality of DRAM cells, each cell comprising:
    a word line;
    a bit line; and
    a nano-electro-mechanical (NEM) relay comprising:
        a cantilever beam;
        a storage capacitor; and
        an electrostatic actuator coupled with the storage capacitor and vertically electrically connected to the word line, wherein said electrostatic actuator is separate from the cantilever beam and applies a high voltage to cause the cantilever beam to electrically connect the storage capacitor to the bit line to perform either a read or write operation.

* * * * *